United States Patent [19]

Tseng

[11] 4,087,833
[45] May 2, 1978

[54] INTERLACED PHOTODIODE ARRAY EMPLOYING ANALOG SHIFT REGISTERS

[75] Inventor: Hsin Fu Tseng, Cupertino, Calif.

[73] Assignee: Reticon Corporation, Sunnyvale, Calif.

[21] Appl. No.: 756,356

[22] Filed: Jan. 3, 1977

[51] Int. Cl.$^2$ .................. H01L 29/78; H01L 27/14; H01L 31/00; H01J 39/12
[52] U.S. Cl. .................................. 357/24; 357/30; 250/211 J; 357/59
[58] Field of Search ............... 357/24, 30; 307/221 D, 307/304; 250/211 J

[56] References Cited

U.S. PATENT DOCUMENTS

| | | | |
|---|---|---|---|
| 3,683,193 | 8/1972 | Weimer | 357/24 |
| 3,715,485 | 2/1973 | Weimer | 357/24 |
| 3,845,295 | 10/1974 | Williams et al. | 357/24 |
| 3,866,067 | 2/1975 | Amelio | 357/24 |
| 3,925,805 | 12/1975 | Erb | 357/24 |
| 4,040,076 | 8/1977 | Kosonocky et al. | 357/24 |

OTHER PUBLICATIONS

Tseng et al., "Optimization of a Solid State Image Sensor," 3rd Int. Conf. Tech. and Applications Charge Coupled Devices, Edinburgh, (9/76), Proc. pp. 75–84.

*Primary Examiner*—William D. Larkins
*Assistant Examiner*—Gene M. Munson
*Attorney, Agent, or Firm*—Blakely, Sokoloff, Taylor & Zafman

[57] ABSTRACT

A photodiode array employing an analog shift register with a line of interlaced photodiodes. Alternate diodes are coupled to one of a pair of analog shift registers which are disposed on opposite sides of the line of photodiodes. An "anti-blooming" polysilicon line and a "transfer" polysilicon line are disposed along each side of the line of photodiodes adjacent to the shift registers. Each of the diffused region forming the photodiodes are coupled by a metal line to another diffused region formed between the anti-blooming and transfer polysilicon lines. This latter region acts as a remote, common region for both the anti-blooming function and transfer function.

11 Claims, 7 Drawing Figures

INTERLACED PHOTODIODE ARRAY EMPLOYING ANALOG SHIFT REGISTERS

BACKGROUND OF THE INVENTION

1. Field of the Invention

The invention relates to the field of semiconductor photodetection, particularly photodetection employing photodiodes and shift registers.

2. Prior Art

The depletion regions of diffused junctions and field induced junctions have been employed for a number of years for the separation of electron/hole pairs which are generated by incident light. Often a doped pn junction (photodiode) in a silicon substrate is employed for this purpose. This doped region is most typically covered with a layer of silicon dioxide, thus the incident light passes through an air/SiO$_2$ interface and an SiO$_2$/Si interface. These interfaces present minimum losses. When induced junctions are employed the incident light is required to travel through a transparent gate member; this introduces two additional interfaces. Moreover, the most commonly employed gate material for this purpose, polycrystalline silicon, absorbs some of this incident radiation, particularly the shorter wavelengths. Thus in many applications the diffused junction is preferred over the induced junction.

Both analog shift registers and digital shift registers are used to read or shift the information sensed by a plurality of junctions to a common terminal or video line. The digital shift register is most often used to sequentially access switches which sequentially connect the junctions to a common video line. With analog shift registers, such as the bucket brigade devices (BBD) and the charged-coupled devices (CCD), charge from a plurality of junctions is simultaneously transfered into the register (in parallel) and then shifted to one end of the register.

Various combinations of the induced and diffused junctions, and analog and digital shift registers are employed in sensing arrays. For example, in U.S. Pat. No. 3,814,846 the combination of digital shift registers and (diffused) photodiodes is described. A plurality of switches are employed to sequentially couple the photodiodes to a common line. One problem inherent in this array is that the non-uniformity of the switches causes a fixed pattern modulation, or noise, which is superimposed on the video output. Moreover, the random noise associated with this array is a function of the output capacitance, and hence, is dependent upon the number of photodiodes in the array. Thus random noise becomes more of a concern with this structure as the number of photodiodes is increased.

In U.S. Pat. No. 3,866,067, the combination of field induced junctions and an analog shift register is disclosed. This structure permits higher density junctions (20 to 30 micron centers), and moreover, has a lower random noise and fixed pattern noise than many other arrays. However, these advantages are offset by the disadvantages that result from process variations. The thicknesses of the layers used to provide the induced junctions, such as the polycrystalline silicone layer, are not uniform. Thus reflectivity as well as absorbtion are not consistent.

It is believed that optimum photodetection may be obtained with a combination of the diffused photodiodes and analog shift registers. This combination is disclosed in U.S. Pat. No. 3,845,295. As shown, the structure includes a row of photodiodes with an analog shift register and transfer means on one side of the photodiodes and the anti-blooming or reset means on the other side of the row of photodiodes. This general architecture is also shown in an article entitled "A charge-Coupled Infrared Imaging Array With Schottky-Barrier Detectors" by Elliott S. Kohn, *IEEE Transactions on Electronic Devices*, Volume ED-23, No. 2, February 1976.

As will be seen, the photodiode array of the present invention uses the combination of analog shift registers and diffused junctions. However, unlike the prior art, an architecture is described which permits the photodiodes to be interlaced or interdigitated. This allows the fabrication of higher density arrays.

SUMMARY OF THE INVENTION

A photodiode array employing diffused junctions and analog shift registers is described. In the presently preferred embodiment, the photodiodes comprise a line of spaced-apart, n-type regions formed in a p-type silicon substrate. An analog shift register is disposed on each sides of the line of photodiodes, generally parallel to this line. An elongated diffused region is formed in the substrate between each side of the line of photodiodes and the shift registers. This diffused region is used as a charge "sink" to prevent blooming. A pair of parallel, spaced-apart polysilicon strips are formed between each of these elongated diffusion regions and the adjacent shift register. A plurality of n-type regions are formed between these polysilicon strips; one of these regions is associated with each of the photodiodes. The photodiodes are alternately connected to one of these n-type regions by metal lines which run generally transverse to the polysilicon strips.

One of the polysilicon strips on each side of the line of photodiodes defines anti-blooming gates and provides conductive channels between the n-type regions and the elongated sink regions. The other polysilicon strips define transfer gates, thereby permitting conduction between the plurality of n-type regions and the analog shift registers. Thus, these n-type regions form remote, common source regions for both the anti-blooming function and the transfer function.

This interlaced structure may also be employed in an area array where a digital shift register is employed to sequentially select rows of photodiodes in the array.

DETAILED DESCRIPTION OF THE INVENTION

Semiconductor photodiode arrays, including both a linear array and an area array, are described. In the following description numerous specific details of the arrays are described (such as specific conductivity types, number of photodiodes in the array, etc.) to provide a thorough understanding of the inventive concepts. However, it will be obvious to one skilled in the art that these inventive concepts may be employed in other embodiments.

In FIGS. 1 through 5, the presently preferred embodiment of the linear array is shown. This array as actually realized includes a line of 1,024 photodiodes, each of which comprises an n-type region formed in a p-type silicon substrate. These photodiodes are alternately coupled to a pair of analog shift registers which are disposed on the opposite sides of the photodiodes. In the presently preferred embodiment, these analog shift registers comprise charge-coupled devices fabricated employing double layers of polysilicon. Other analog shift registers such as bucket-brigade devices, may be employed. With the interlaced or interdigitated architecture of the array which shall be described in detail, photodiode-to-photodiode pitch of approximately sixteen microns has been realized.

Figure 3:
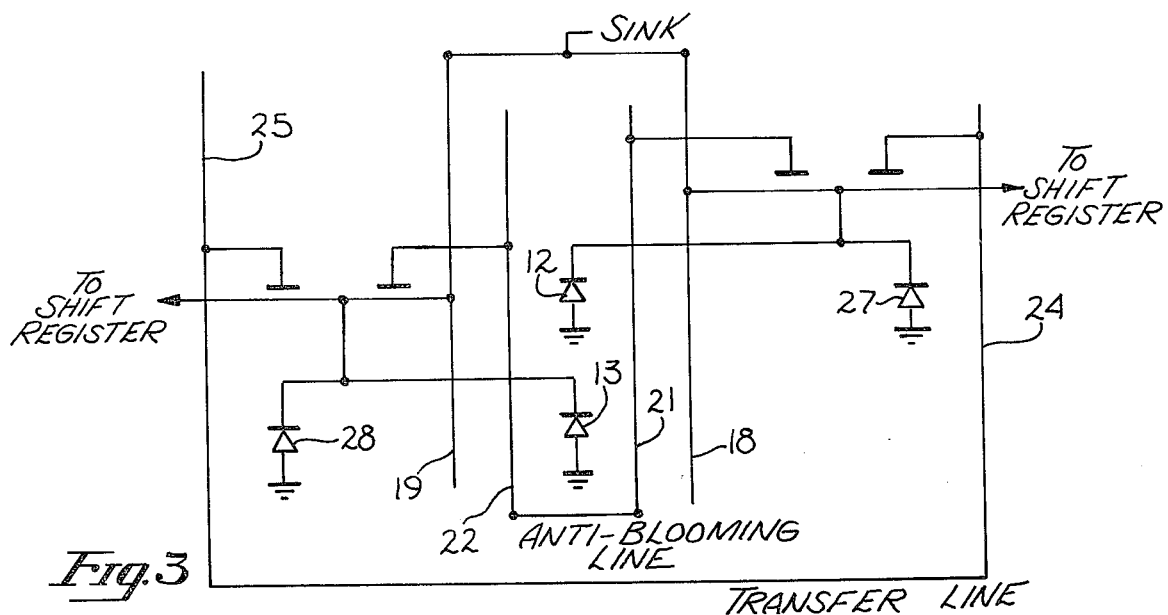
FIG. 3 is an equivalent circuit for the array of FIG. 1.
Figure 4:
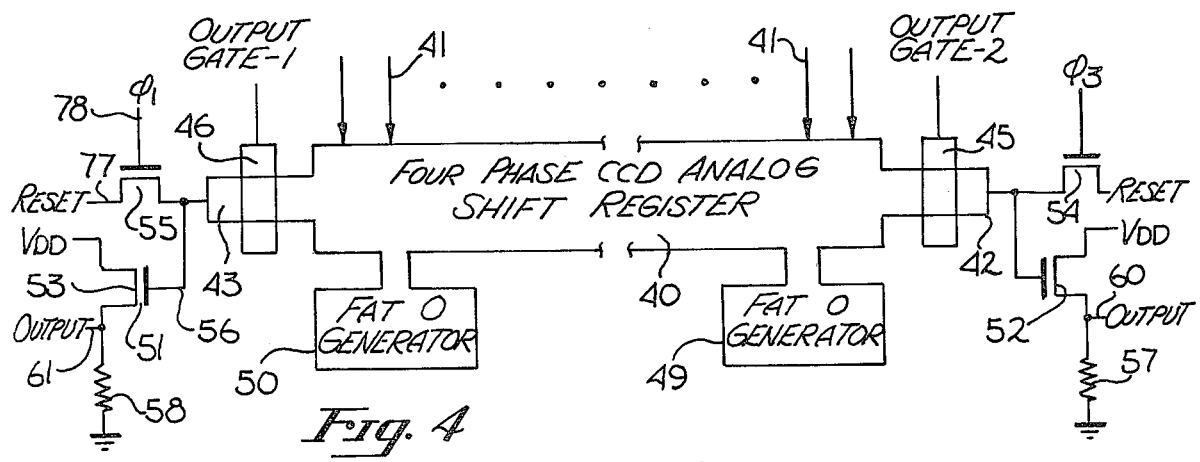
FIG. 4 is a partial schematic of an analog shift register which may be employed with the array of FIGS. 1 and 2.
Figure 5:
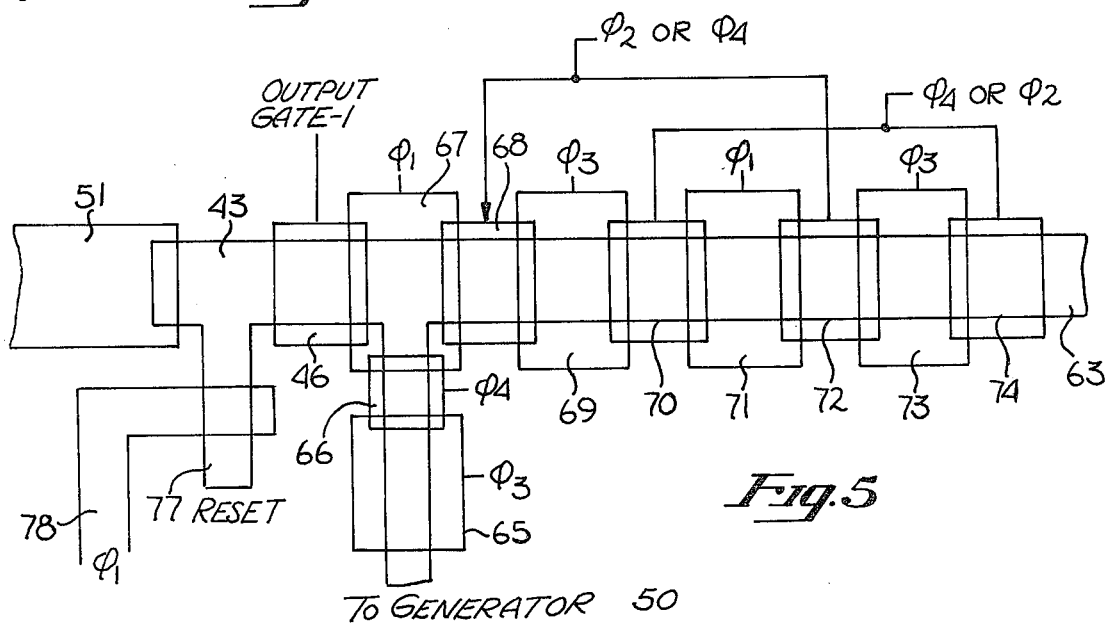
FIG. 5 is a partial plan view of one end of the analog shift register of FIG. 4.

In FIGS. 4 and 5, the analog shift register is described in more detail. In particular, the structure of this charge-coupled device which permits information from the photodiodes to be shifted in either direction is discussed. It will be apparent to one skilled in the art that this particular aspect of the invention need not be employed with the structure of FIGS. 1, 2 and 3.

Figure 6:
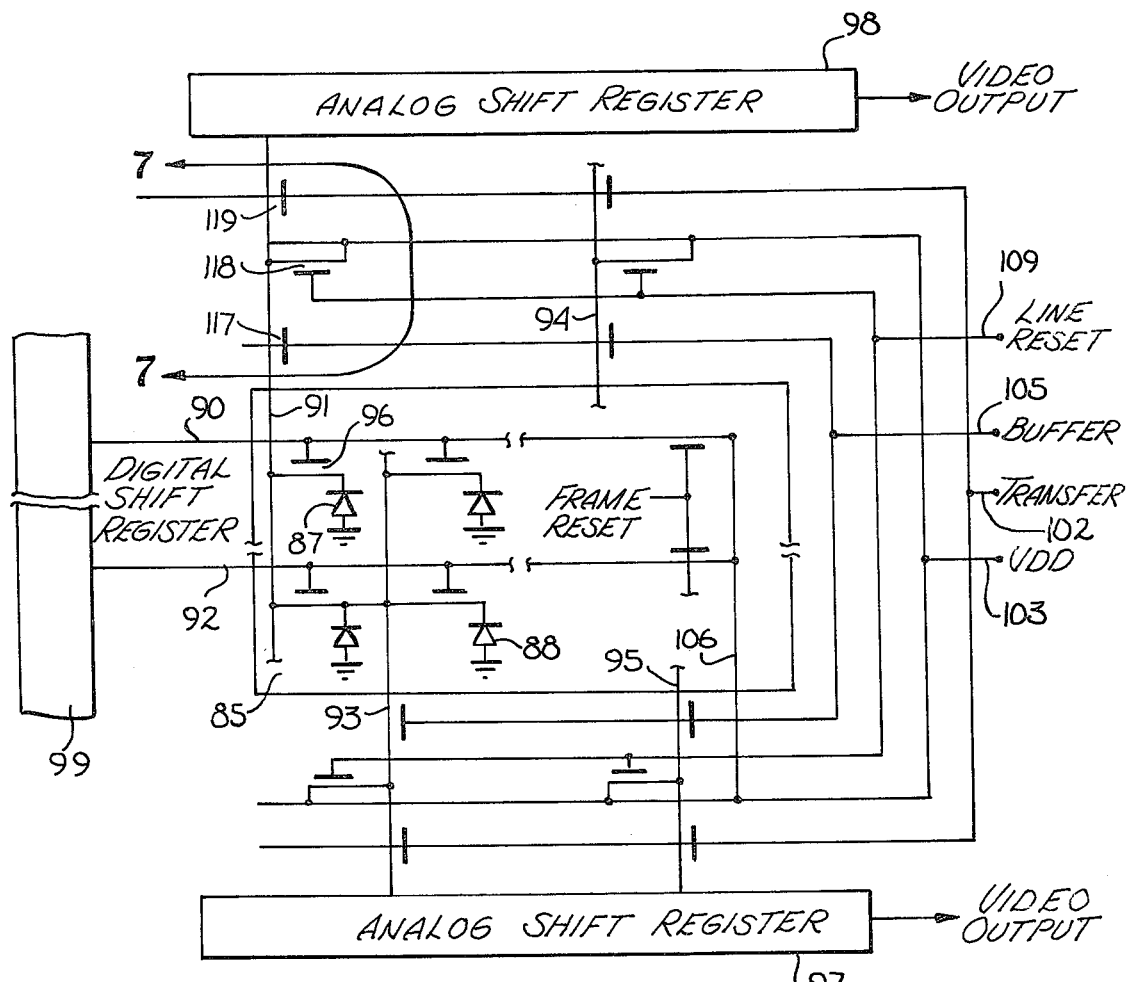
FIG. 6 is a general block diagram of an area photodiode array fabricated in accordance with the present invention; and, FIG. 7 is a partial plan view of the array of FIG. 6 taken through section line 7—7 of FIG. 6.
Figure 7:
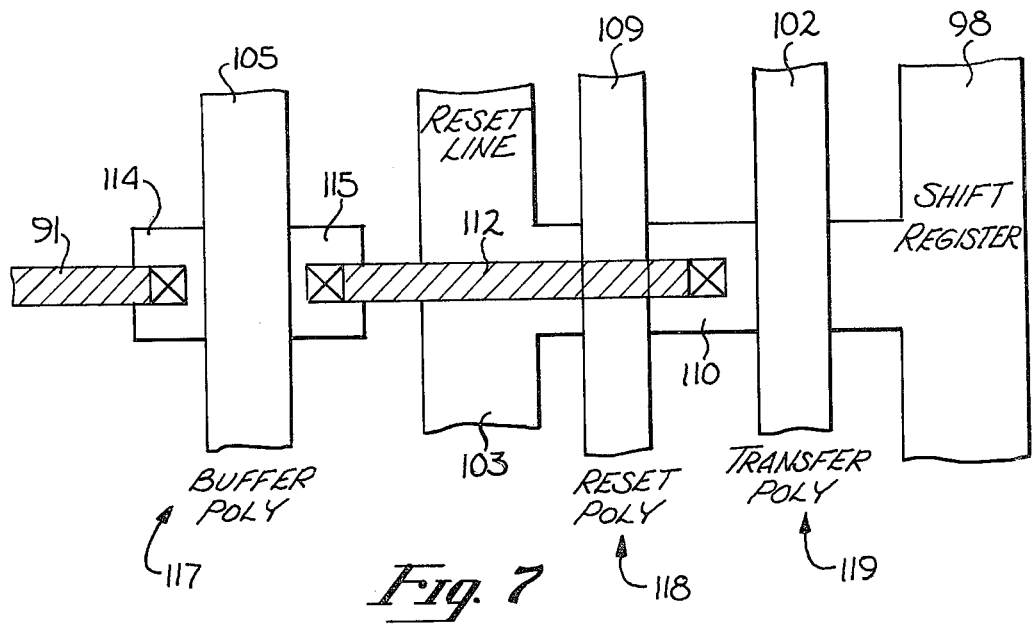

In FIGS. 6 and 7, the interlaced diode structure is shown employed in a area array. The presently preferred embodiment of this array is a 256 × 256 array with 1.5 mil × 1.5 mil centers formed on a silicon substrate of approximately 400 × 400 mils. Again this embodiment employs charge-coupled devices for the analog shift registers.

Throughout the specification reference will be made to the anti-blooming function or reset function. This function is well-known in the prior art and is employed to prevent the spread of charge from one diode region to another (blooming). This function will not be described in detail in this application since it is well documented in the prior art.

The detail fabrication steps employed in fabricating the arrays described in this application are not set forth. Well-known MOS technology may be employed for this purpose. The presently preferred embodiments of the arrays are fabricated on p-type silicon substrates employing polycrystalline silicon (polysilicon) gates. In the specification and claims the words "doped regions" and "diffused regions" are employed interchangeably. It will be understood that these regions may be formed with ordinary diffusion steps or through ion implantaion.

Figure 1:
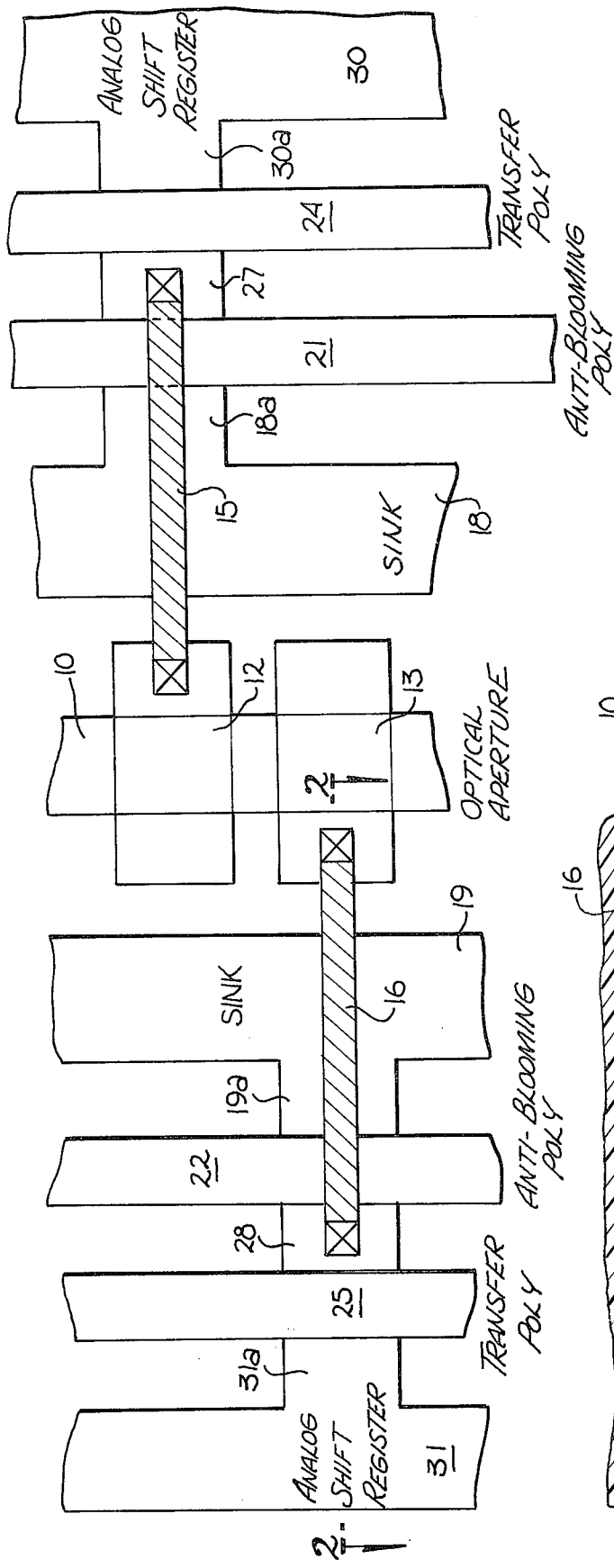
FIG. 1 is a partial plan view of a linear photodiode array fabricated in accordance with the present invention.
Figure 2:
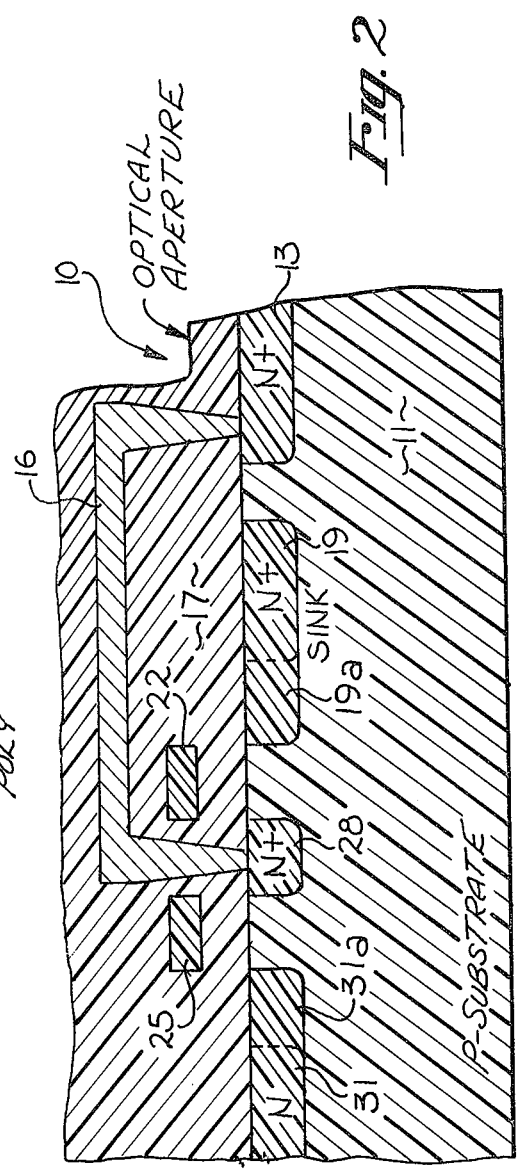
FIG. 2 is a cross-sectional elevation view of a portion of the array of FIG. 1, taken generally through section line 2—2 of FIG. 1.

Referring now to FIGS. 1 and 2, the linear array includes an elongated optical aperture 10 which receives the incident radiation. This radiation is detected by a plurality of photodiodes disposed in an elongated line which is coincident with the aperture 10. Two such photodiodes are shown in the plan view of FIG. 1. Each of the photodiodes comprises a doped n-type region formed in the p-type silicon substrate 11 (FIG. 2). Regions 12 and 13 are shown in the plan view of FIG. 1 and region 13 is shown in the cross-sectional view of FIG. 2.

In the interlaced array of FIGS. 1 and 2, the photodiodes are alternately coupled to analog shift registers disposed on opposite sides of the array. For example, region 12 is coupled, as will be explained, to the analog shift register 30 disposed on the right-hand side of the photodiodes, while region 13 is coupled to the analog shift register 31 which is disposed on the left-hand side of the photodiodes. By interlacing the diodes in this manner, a denser array may be fabricated since typically the linear dimension required for each stage of the shift register is greater than the center-to-center distance required to form the photodiodes. This results in a higher speed array with less charge transfer.

Examining first the left-hand side of the array, an elongated line 19 which conprises a diffused region in the substrate 11 is formed generally parallel to the line of photodiodes, adjacent to these diodes. This line, as will be described, forms a potential sink for the reset or anti-blooming function. Adjacent to the line 19, and in general juxtaposition with this line, is a pair of spaced-apart polycrystalline silicon strips 22 and 25. These strips are insulated from the substrate 11 by the silicon dioxide layer 17 as is best illustrated in FIG. 2. One of these strips, strip 22, receives the anti-blooming signal while the other of these strips, strip 25, receives the transfer signal.

An n-type region 28 is formed in the substrate between the strips 22 and 25. This region is coupled to the region 13 by a metal line 16 which crosses over the polysilicon strips 22. This line includes contacts which extend to, and contact, regions 13 and 28. As will be described, the region 28 forms a remote source terminal for a pair of MOS field-effect transistors, one of which includes region 31 as a drain terminal, and the other of which includes the sink line 19 as a drain terminal.

In the fabrication of the array, the region 28 is formed in the substrate after the elongated polysilicon strips 22 and 25 have been etched. Thus region 28 is aligned with these strips. Moreover, during this doping step the regions 19a and 31a are formed such that the region 19a of the sink line 19 is in alignment with the polysilicon line 22, and the region 31a which is directly coupled to the analog shift register 31 is in alignment with the polysilicon line 25. As is apparent from FIG. 2, the polysilicon strips 22 and 25 form a plurality of gates for field-effect transistors at each of the regions 28. (Note that regions 31 and 31a and like regions are shown as n-type regions in FIG. 2, these regions for a CCD are induced channels).

On the opposite side of the line of photodiodes a symmetrical architecture is employed, including a metal line 15 which interconnects the region 12 with the n-type region 27. (Region 27 corresponds to region 28). Again, an elongated sink line 18 is formed in the substrate, which line is aligned with the anti-blooming polycrystalline silicon strip 21 by region 18a. The transfer polycrystalline silicon strip 24 is aligned with the region 30a, which region is coupled to the analog shift register 30.

While only two photodiodes are shown in the plan view of FIG. 1, it will be appreciated that the remaining photodiodes disposed along the optical aperture 10 are coupled to the shift registors in a identical manner. That is, alternate photodiodes are coupled to consecutive stages of the analog shift register 30 with the remaining (alternate) photodiodes coupled to the consecutive stages of the analog shift register 31.

Referring to the equivalent circuit of FIG. 3, regions 12 and 13 are shown as diodes as are the regions 27 and 28. However, the diodes 27 and 28 are not exposed to the incident radiation and hence, act as source regions for transferring charge to either the sink lines or to the analog shift registers. The polysilicon strips 24 and 25 are coupled to a common line and receive the transfer signal for transferring charge from the photodiodes into the analog shift registers. The sink lines 18 and 19 are coupled to a source of fixed positive potential. The strips 21 and 22 receive the anti-blooming signal, which signal couples the photodiodes through regions 27 and 28 to the sink lines.

The photodiode array operates in a somewhat normal manner for a photodiode array which includes diffused diodes and an analog shift register. During the integration period, that is, during the period that incident light is detected, the incident light causes an accumulation of charge in regions 12 and 13. This charge is transferred by the metal lines to the regions 27 and 28, respectively. Next, a positive potential is applied to the transfer strips 24 and 25. Charge is thus simultaneously coupled from all the photodiodes (and remote source regions, such as region 27) to the shift registers. Referring briefly to FIG. 2 this transfer of charge occurs in the channel defined by regions 28 and 31a and like channels. These regions along with the strips 25 form a field-effect transistor which operates as a switch to permit the flow of charge from region 28 into the analog shift register.

Resetting of the photodiodes is accomplished by the application of a positive potential to the strips 21 and 22. This couples the photodiodes to the sink lines. As may be seen in FIG. 2, region 28 again acts as a source region when charge is transferred through the channel defined by regions 19a and 28. These regions along with the strip 22 (a gate) operate as a field-effect transistor. Thus, the region 28 serves as a common source region for both the transfer function and anti-blooming or reset function.

In FIG. 4 an analog shift register 40 is shown which is a four phase charge-coupled device. This register is employed, in the presently preferred embodiment, of the photodiode array for each of registers 30 annd 31 of FIGS. 1 and 2. Each stage of the register is coupled to alternate photodiodes through lines 41. When a transfer of charge from the photodiodes (through the remote source regions) occurs, the information represented by this charge is shifted along the register and sensed at either line 60 or 61. Thus the information may be shifted either to the right, to line 60; or to the left, to line 61.

One end region 43 of the register 40 is coupled to a line 56 which line is common with the gate 51 of transistor 53 and one terminal of transistor 55. The other terminal of transistor 55 (line 77) receives a reset potential which is coupled to region 43 when the signal on line 78 is positive. The drain terminal of transistor 53 is coupled to the positive potential, $V_{DD}$; the source terminal is coupled to ground through a load resistor 58. The output line 61 is coupled to the source terminal of transistor 53.

The other end of the register 40 includes an end region 42 which is coupled to one terminal of transistor 54 and to the gate of transistor 52. The other terminal of transistor 54 receives the reset potential when the $\phi_3$ signal is positive. The drain terminal of transistor 52 is coupled to $V_{DD}$, while the source terminal of this transistor is coupled to the output line 60 and to ground through the load resistor 57.

When charge is shifted to the right in register 40, a positive potential is applied to gate 45 to allow the charge to be sensed at the load resistor 57. Similarly, when charge is shifted to the left, a positive potential is applied to gate 46 to allow the charge to be shifted to the gate 51 of transistor 53 and be sensed at the load resistor 58.

As is known in the prior art, surface channel CCDs operate more efficiently if there always is charge to be shifted in each stage of the register. When CCDs are employed to shift binary date, the two binary states are represented by a relatively large amount of charge and a relatively small amount of charge (as opposed to no charge). This latter charge is often referred to as a "fat zero". In order to provide efficient transfer of data in register 40, a pair of "fat zero" generators are coupled at opposite ends of the register. When charge is transferred to the right, that is, for sensing at line 60, the charge pumped into the register by generator 50 assures efficient transfer of charge. When charge is shifted to the left, that is, for sensing on line 61, the "fat zero" generator 49 assures efficient transfer of charge. In the presently preferred embodiment, both generators 49 and 50 are "ON" when charge is shifted either to the right or left. While this is not necessary, it avoids logic circuits which would be necessary to control the generators. (By way of example, generator 50 could be off when the charge is moved to the left. The additional charge added by generator 50 does not effect the output signal since an equal amount of charge is added at each cycle.)

In FIG. 5 the left-hand end of register 40 is shown. The region 43 is coupled to an elongated channel 63, which channel extends the entire length of the register. The region 43 is also coupled to the gate 51 of transistor 53 and to the reset line 77.

As previously mentioned, in the presently preferred embodiment, the charge-coupled devices employ two layers of polycrystalline silicon for defining transfer gates. In FIG. 5, gates 46, 66, 68, 70, 72 and 74 are formed from the second level of polycrystalline silicone while gates 67, 69, 71 and 73 are etched from the first level of polycrystalline silicon. Gates 67 and 71 receive the $\phi_1$ signal of the four-phase timing signals, gates 69 and 73 are coupled to the source of the $\phi_3$ timing signal. Gates 68 and 72 receive either the $\phi_2$ or $\phi_4$ timing signal depending upon the direction in which the charge is to be shifted. Similarly, gates 70 and 74 receive either the $\phi_4$ or $\phi_2$ timing signal depending upon the direction in which the charge is to be shifted. The gates 65 and 66 are employed to transfer charge from the fat zero generator 50 into the register. This charge is shifted into region 43 if the charge in the register is moving to the left, or is shifted below gate 68 if the charge in the register is moving to the right.

Assume that the charge is being shifted to the left and that a positive potential has been applied to the gate 46. During each cycle of the four timing signals the charge in a stage in the register is shifted to gate 51 of transistor 53 and a signal proportional to this charge is applied to line 61. The gate 51 of transistor 53 is reset by the $\phi_1$ timing signal during each cycle by coupling this gate to line 77.

The principles of the interlaced photodiode array described in conjunctions with FIGS. 1 and 2 may be employed in an area array such as the area array shown in FIG. 6. This array includes an area photodiode array 85 having a plurality of column lines or video lines, such as lines 91, 93, 94 and 95. These lines are alternately connected to either the analog shift register 97 or 98. The array includes a plurality of row lines such as lines 90 and 92 which are coupled to a digital shift register 99. A field-effect transistor is formed at the intersection of each of the row and column lines to selectively couple the photodiodes to the video (column) lines. For example, a photodiode 87 which comprises a diffused region in the substrate is coupled to the video line 91 through the transistor 96. The gate of transistor 96 is formed by line 90. Similarly, line 92 forms a plurality of gates that are used to couple diodes to column lines such as diode 88 to line 93. Thus, when a positive potential is applied to line 90 (for an n-channel embodiment) all the diodes along line 90 are connected to video lines. Note that when this occurs diodes are coupled to both registers 97 and 98.

Each of the video lines is coupled to its respective shift register through a transfer means and a anti-blooming means which are similar to the transfer means and anti-blooming means described in conjunction with FIGS. 1 and 2. In FIG. 7 the video line 91 of FIG. 6 is shown coupled to the shift register 98. The metal line 91 is coupled to an n-type region 114, which region is formed in the substrate. An n-type region 115 is formed in the substrate, spaced-apart from region 114. A gate which is formed by an elongated polysilicon strip 105 disposed between the regions 114 and 115. It is apparent that regions 114 and 115 along strip line 115 form a field-effect transistor 117.

Region 115 is coupled by the metal line 112 to an n-type region 110. Region 110 corresponds to the remote source regions 27 and 28 described in conjunction with FIGS. 1 and 2. Region 110 is formed in alignment with the spaced-apart polycrystalline silicon strips 102 and 109. One edge of line 109 is in alignment with a portion of the reset line 103. This reset line corresponds to the sink lines 18 and 19 of FIGS. 1 and 2. Line 103 comprises an elongated n-type diffusion formed in the substrate which is coupled to a positive potential. As may be seen in FIG. 7, line 103, region 110 and strip 109 form a field-effect transistor 118. Similarly region 110, the n-type region extending from register 98 to strips 102 and strips 102 define a field-effect transistor 119.

The coupling of the video line 91 to the shift register 98 and reset (anti-blooming) line 103 is similar to the coupling of the photodiodes of FIGS. 1 and 2 with their respective shift registers, however, with the addition of the field-effect transistor 117. Assume that the digital shift register 99 has applied a positive potential to line 90. When this occurs, by way of example, photodiode 87 is coupled to the video line 91. Line 91, in turn, is coupled to region 110 through transistor 117. As presently implemented, a reset signal is applied to strips 109 until the transfer of charge into the shift register 98 occurs. Thus prior to the transfer, region 110 is coupled to the line 103 through transistor 118. During the transfer of charge to the shift register, the potential on strip 109 drops and a potential is applied to line 102 transferring charge from the region 110 into the shift register 98 through transistor 119. Simultaneously with this transfer charge is transferred from the other photodiodes along 90 into the registers 98 and 98. Then this information is shifted from the analog shift registers 97 and 98 to the video output lines. The digital shift register sequentially couples a positive potential to each of the row lines in the array in a known manner. The row lines may be coupled through line 106 to $V_{DD}$ to simultaneously reset all row lines.

The transistor 117 is employed as will be described to reduce noise in the array. The ratio of the capacitances of the video line 91 and line 112 ($C_v$) to the capacitance of a single photodiode $C_s$ increases as the array is made larger. This increased ratio contributed to crosstalk and fixed pattern noise. Also it is apparent that the differences between the threshold voltages of transistors 118 and 119 (and like transistors) will vary with each of the video lines due to processing variations. This difference may be represented by $\Delta V_t$. The fixed pattern noise may be written as $Q_{noise} = C_v \Delta V_t$. As $C_v$ becomes much larger than Cs, this noise level becomes unacceptable when compared to the signal levels which must be detected from the photodiodes. The transistor 117 is employed to isolate the capacitance of the video line 91 from the region 110. This is accomplished by maintaining the line 105, that is, the gate of transistor 117, at a positive potential below the potential used to power the array (i.e., 1 or 2 volts below $V_{DD}$). This effectively isolates the capacitance of line 91 from junction 110. Thus the transistor 117 substantially reduces the noise of the array and permits the fabrication of larger arrays.

Thus, an interlaced or interdigitated photodiode array has been described which employs a diffused regions for photodiodes and an analog shift register. The anti-blooming means and transfer means with the disclosed structure may be fabricated on the same side of the line of photodiodes thereby permitting the interlaced structure. Buffering means are also described, particularly for the area array which reduces the capacitance sensed at the transfer node, thereby reducing the fixed pattern noise.

I claim:

1. A photodiode array formed on a substrate of a first conductivity type comprising:
   a line of photodiodes each of which comprises a first doped region of a second conductivity type disposed in said substrate;
   a pair of analog shift registers, each disposed on an opposite side of said line of photodiodes;
   a pair of elongated doped regions of said second conductivity type disposed in said substrate, each disposed on said opposite sides of said line of photodiodes between said line of photodiodes and said registers;
   a first pair of elongated conductive strips insulated from said substrate, each disposed on said opposite sides of said line of photodiodes between said elongated doped regions and said registers;
   a second pair of elongated conductive strips insulated from said substrate, each disposed on said opposite sides of said line of photodiodes between said first elongated strips and said registers, said second strips spaced-apart from said first strips;
   a plurality of second doped regions of said second conductivity type disposed in said substrate disposed between each of said spaced-apart first and second elongated strips;
   a plurality of connector means for coupling photodiodes with said second regions such that alternate ones of said photodiodes are coupled to said second regions on said opposite sides of said line of photodiode;
   whereby an interlaced photodiode array is formed which includes anti-blooming means and transfer means on each of said sides of said line of photodiodes.

2. The array defined by claim 1 wherein each of said connector means include metal contacts which crossover one of said second strips.

3. The array defined by claim 2 wherein said first and second doped regions and said elongated doped regions comprise n-type regions.

4. The array defined by claim 3 wherein said first and second pair of elongated strips are polycrystalline silicon strips, and wherein said second doped regions are formed in alignment with said strips.

5. The array defined by claim 1 wherein said pair of analog shift register each comprise a charge-coupled device.

6. The array defined by claim 5 wherein each of said charge-coupled devices are four-phase devices, and wherein charge may be shifted in either direction in said devices.

7. The array defined by claim 6 including charge generation means for coupling nominal quantities of charge into each end of each of said charge-coupled devices for enhancing transfer efficiency in said devices.

8. In a semiconductor photodiode array formed on a silicon substrate of a first conductivity type and employing a line of diffused junctions in said substrate of a second conductivity type for sensing light, an analog shift register for reading information from said diffused junctions, transfer means for transferring charge from said junctions to said shift register and anti-blooming means for presenting blooming of charge in said junctions, an improvement which permits said analog shift register, transfer means and anti-blooming means to be fabricated on one side of said line of diffused junctions comprising:

a pair of spaced-apart, elongated conductive strips insulated from said substrate defining a plurality of gates, one of said strip for receiving an anti-blooming signal, the other of said strip for receiving a transfer signal, said strips in juxtaposition with said one side of said line of photodiodes;

an elongated region of said second conductivity type disposed in said substrate between said one of said strips and said line of photodiodes;

a plurality of diffused regions of said second conductivity type formed in said substrate and disposed between said spaced-apart strips; and coupling means for coupling at least some of said diffused junctions with one of said plurality of diffused regions;

said conductive strips, elongated region and diffused regions cooperatively operating such that by the application of said anti-blooming signal to said one of said strips, said diffused junctions are coupled to said elongated region for controlling blooming, and by the application of said transfer signal to said other of said strips, charge from said junctions is transferred to said shift register;

whereby a denser array may be fabricated.

9. The improvement defined by claim 8 wherein said diffused regions are all n-type regions.

10. The improvement defined by claim 9 wherein said pair of spaced-apart, elongated strips are polycrystalline silicon members.

11. The improvement defined by claim 8 including means for transferring charge in said shift register in either direction.

* * * * *